(12) United States Patent
Murakami (10) Patent No.: US 11,193,956 B2
(45) Date of Patent: Dec. 7, 2021

(54) SAMPLING OSCILLOSCOPE, TRIGGER GENERATION METHOD, AND SAMPLING METHOD

(71) Applicant: ANRITSU CORPORATION, Kanagawa (JP)

(72) Inventor: Takashi Murakami, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 398 days.

(21) Appl. No.: 16/220,848

(22) Filed: Dec. 14, 2018

(65) Prior Publication Data

US 2019/0227103 A1 Jul. 25, 2019

(30) Foreign Application Priority Data

Jan. 24, 2018 (JP) .............................. JP2018-009766

(51) Int. Cl.
| | | |
|---|---|---|
| *G01R 13/02* | (2006.01) | |
| *G06F 1/04* | (2006.01) | |
| *G06F 1/02* | (2006.01) | |
| *G06F 3/05* | (2006.01) | |

(52) U.S. Cl.
CPC ..... *G01R 13/0272* (2013.01); *G01R 13/0254* (2013.01); *G06F 1/022* (2013.01); *G06F 1/04* (2013.01); *G06F 3/05* (2013.01)

(58) Field of Classification Search
CPC . G01R 13/0272; G01R 13/0254; G06F 1/022; G06F 1/04; G06F 3/05
USPC ....................................................... 702/66
See application file for complete search history.

(56) References Cited

U.S. PATENT DOCUMENTS

| | | | | |
|---|---|---|---|---|
| 4,952,877 A | * | 8/1990 | Stormont | ............. G01R 33/583 |
| | | | | 324/307 |
| 7,284,141 B2 | | 10/2007 | Stickle | |
| 7,339,984 B1 | * | 3/2008 | Daou | ........................ H03L 7/18 |
| | | | | 375/225 |
| 2002/0039396 A1 | * | 4/2002 | Zalio | ..................... G06F 1/0328 |
| | | | | 375/355 |

(Continued)

FOREIGN PATENT DOCUMENTS

| | | | |
|---|---|---|---|
| JP | 2018136261 | * | 8/2018 |
| JP | 2018137681 | * | 8/2018 |

OTHER PUBLICATIONS

English translation of JP 2018-137681, Aug. 2018. (Year: 2018).*
English translation of JP 2018-136261, Aug. 2018. (Year: 2018).*

*Primary Examiner* — Michael P Nghiem
(74) *Attorney, Agent, or Firm* — Pearne & Gordon LLP (57) ABSTRACT

A sampling oscilloscope includes a trigger generation circuit that includes a direct digital synthesizer (DDS) that outputs a trigger clock input in an operable frequency range at an arbitrary output frequency, a band pass filter (BPF) that limits a pass band of the trigger clock output from the direct digital synthesizer and a variable frequency divider that divides a frequency of the trigger clock of which the pass band is limited by the band pass filter, and generates a strobe signal of a frequency at which a sampler can be operated. The sampling oscilloscope includes a controller that calculates a phase shift amount with reference to a pattern cycle of data generated by a one-time strobe signal and adjusts a phase by changing a count value of a phase accumulator of the direct digital synthesizer so that the calculated phase shift amount is eliminated.

8 Claims, 5 Drawing Sheets

(56) References Cited

U.S. PATENT DOCUMENTS

2005/0138094 A1\* 6/2005 Sullivan ................ G06F 1/0328
708/270

\* cited by examiner

FIG. 1

| Pattern length [bit] | m value to be employed | Total symbol shift amount $2^9*m$ [bit] | Shift amount at cycle Mod (Total symbol shift amount, pattern length) [bit] | Estimated sampling rate [kHz] @26.565 G | Reference |
|---|---|---|---|---|---|
| 127 | 381 | 195072 | 0 | 136.1677 | PRBS7 |
| 511 | 448 | 229376 | 448(−63) | 115.8033 | PRBS9 |
| 8191 | 384 | 196608 | 24 | 135.1039 | PRBS13 |
| 32767 | 384 | 196608 | 6 | 135.1039 | PRBS15 |
| 65535 | 384 | 196608 | 3 | 135.1039 | PRBS16 SSPRQ |

SAMPLING OSCILLOSCOPE, TRIGGER GENERATION METHOD, AND SAMPLING METHOD

TECHNICAL FIELD

The present invention relates to a sampling oscilloscope, a trigger generation method, and a sampling method for displaying a waveform based on sampling data from a sampler.

BACKGROUND ART

In Patent Document 1, a technique for sampling a pattern signal using a sampler in accordance with a strobe signal generated using a direct digital synthesizer (DDS) and a programmable counter has been proposed.

However, in recent years, due to the spread of mobile terminals or cloud computing, data line traffic keeps rising and its communication speed has become remarkably high. Further, the international standard relating to high speed data transmission has been changed from nonreturn-to-zero (NRZ) format in the related art to pulse amplitude modulation 4 (PAM 4) format together with an electric interface or an optical interface.

Further, with respect to such PAM 4, in Institute of Electrical and Electronics Engineers (IEEE) 802.3bs, analysis of Short Stress Pattern Random Quaternary (SSPRQ) having a pattern length of 65535 symbols is necessary.

RELATED ART DOCUMENT

[Patent Document]
[Patent Document 1] U.S. Pat. No. 7,284,141

DISCLOSURE OF THE INVENTION

Problem that the Invention is to Solve

However, in sampling oscilloscopes in the related art, including the above-described technique disclosed in Patent Document 1, there are problems in that in a case where a pattern signal shows a long-cycle pattern such as the above-mentioned SSPRQ, it is not possible to perform pattern locking at a fast sampling speed, and also, it takes time for analysis.

More specifically, in the sampling oscilloscopes in the related art, in a case where data is sampled as a time-series waveform, a trigger clock frequency is synchronized with a pattern length of data (pattern locking), and a process is realized by phase modulation using a phase shift function of a direct digital synthesizer. Here, in order to perform pattern locking with respect to a pattern signal having a large pattern length, setting of a frequency division rate becomes large, and consequently, a sampling rate noticeably decreases.

Specifically, for example, in the case of PRBS15 having a pattern length of 32767 symbols, in order to synchronize a frequency of a trigger clock with a pattern length, it is necessary to divide a frequency of an output of a direct digital synthesizer into 32767. Here, since the output frequency of the direct digital synthesizer is a frequency of about 1.1 GHz, in the case of 32767 frequency division, 32 kHz is obtained, and the sampling rate becomes 32 kHz at maximum. Here, in reality, since a clean positive number is not obtained in the direct digital synthesizer, there is a possibility that 32 frequency division is further performed and the output may drop down to about 1 kHz.

Accordingly, in consideration of the above-mentioned problems, an object of the invention is to provide a sampling method capable of performing pattern locking at a fast sampling speed even in the case of a long-cycle pattern, compared with the techniques in the related art.

Means for Solving the Problem

According to a first aspect of the invention, there is provided a sampling oscilloscope including: a trigger generation circuit that includes a direct digital synthesizer (DDS) that has a phase accumulator and outputs an input trigger clock at an output frequency on the basis of a count value of the phase accumulator, a band pass filter that limits a pass band of the trigger clock output from the direct digital synthesizer, and a variable frequency divider that divides a frequency of the trigger clock of which the pass band is limited by the band pass filter, and generates a strobe signal for sampling an input pattern signal; and a controller that controls the direct digital synthesizer and the trigger generation circuit, in which the controller calculates a phase shift amount of a strobe cycle of the strobe signal with reference to a pattern cycle of the pattern signal, and adjusts a phase by changing the count value of the phase accumulator of the direct digital synthesizer so that the calculated phase shift amount is eliminated.

According to a second aspect of the invention, in the sampling oscilloscope according to the first aspect of the invention, the controller dividedly performs the change of the count value for the adjustment of the phase shift amount a plurality of times.

According to a third aspect of the invention, in the sampling oscilloscope according to the second aspect of the invention, the count value is changed within one pattern cycle of the pattern signal.

According to a fourth aspect of the invention, there is provided a trigger generation method that generates a strobe signal for sampling an input pattern signal using a trigger generation circuit that includes a direct digital synthesizer (DDS) that has a phase accumulator and outputs an input trigger clock at an output frequency on the basis of a count value of the phase accumulator, a band pass filter that limits a pass band of the trigger clock output from the direct digital synthesizer, and a variable frequency divider that divides a frequency of the trigger clock of which the pass band is limited by the band pass filter, including: a phase shift amount calculation step of calculating a phase shift amount of a strobe cycle of the strobe signal with reference to a pattern cycle of the pattern signal; and a phase adjustment step of adjusting a phase by changing the count value of the phase accumulator of the direct digital synthesizer so that the phase shift amount calculated in the phase shift amount calculation step is eliminated.

According to a fifth aspect of the invention, the trigger generation method according to the fourth aspect of the invention further includes: a step of dividedly performing the change of the count value for the adjustment of the phase shift amount calculated in the phase shift amount calculation step a plurality of times.

According to a sixth aspect of the invention, in the trigger generation method according to the fifth aspect of the invention, the count value is changed within one pattern cycle of the pattern signal.

According to a seventh aspect of the invention, in the sampling oscilloscope according to the first aspect of the invention, the pattern signal is sampled by a sampler at a sampling timing based on the strobe signal.

According to an eighth aspect of the invention, there is provided a sampling method including a step of sampling the pattern signal using the sampler at a sampling timing based on the strobe signal, according to the fourth aspect of the invention.

Advantage of the Invention

According to the invention, it is possible to perform pattern locking at a sampling speed faster than that in the related art even in the case of a long-cycle pattern, and to realize analysis using the pattern locking at high speed.

BEST MODE FOR CARRYING OUT THE INVENTION

Hereinafter, an embodiment for realizing the invention will be described in detail with reference to the accompanying drawings.

Outline of the Invention

Figure 1:
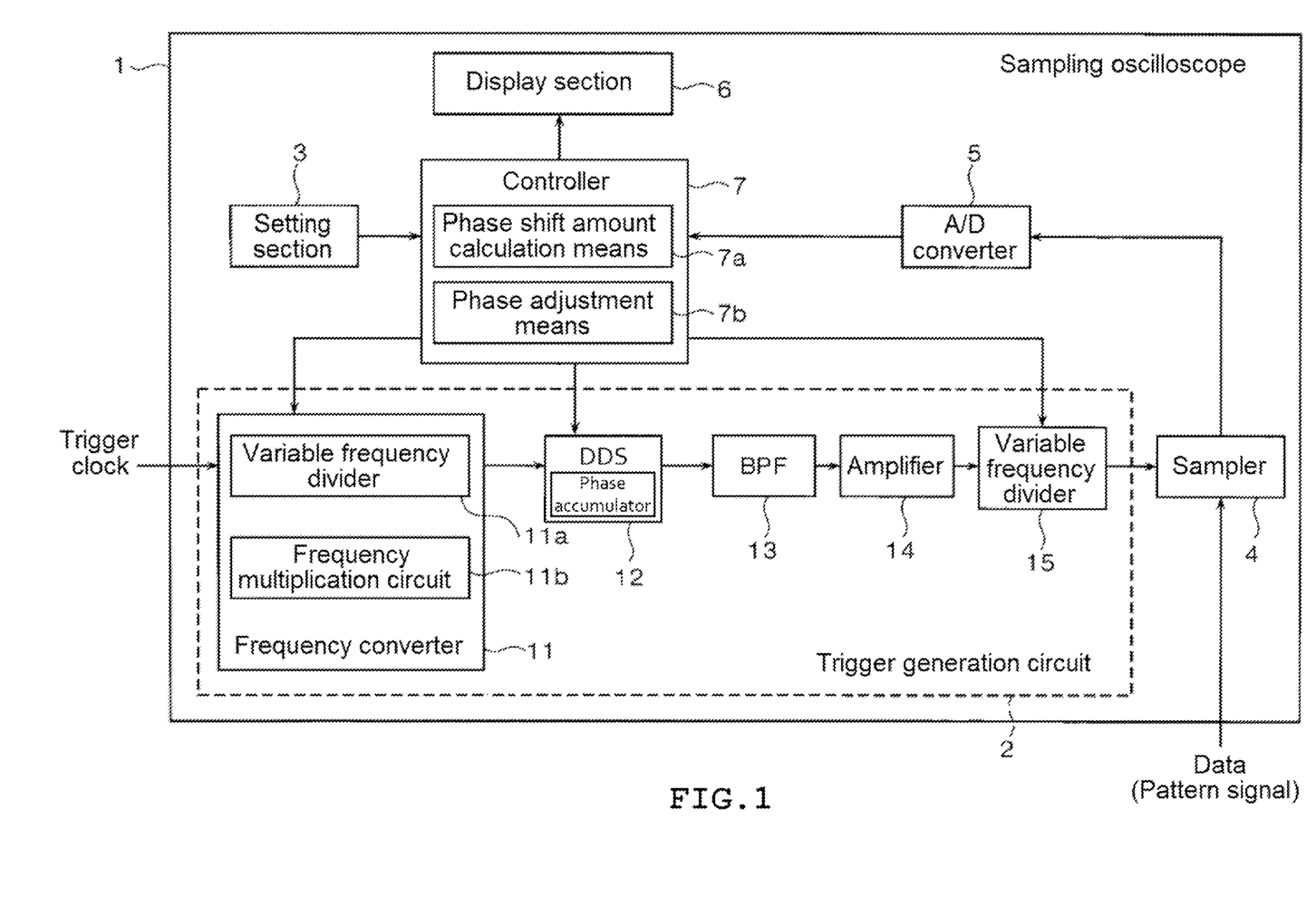
FIG. 1 is a block diagram showing an overall configuration of a sampling oscilloscope that includes a trigger generation circuit according to the invention.

In FIG. 1, it is preconditioned that a clock frequency of a trigger clock synchronized with data (pattern signal) is a Baud rate. In a case where a frequency-divided clock is used as the trigger clock, a frequency division rate is additionally used as a weight of a variable frequency divider 11*a*.

Since it is necessary that an input frequency DDSInput of a direct digital synthesizer (DDS) 12 is 1.25 GHz to 2.5 GHz, it is necessary that the input frequency DDSInput is frequency-divided by the variable frequency divider 11*a*. Since the variable frequency divider 11*a* employs the power of 2, the input frequency DDSInput of the direct digital synthesizer 12 is expressed as DDSInput=Baud rate*$1/2^n$.

Further, it is necessary that an output frequency DDSOutput of the direct digital synthesizer 12 is a frequency capable of passing through a band pass filter (BPF) 13. In a case where the DDS 12 employs α/32 frequency division (α is a positive number of 18 to 29) in calculation, the output frequency DDSOutput of the direct digital synthesizer 12 is expressed as follows.

$$DDSOutput=DDSInput*\alpha/32=Baud\ Rate*1/2^n*\alpha/32$$

Here, α is a parameter for settling the output frequency DDSOutput of the direct digital synthesizer 12, and is calculated so that the output frequency DDSOutput of the direct digital synthesizer 12 becomes a frequency (1.08 GHz or 1.7 GHz) capable of passing through the band pass filter 13.

Further, the result is frequency-divided by a variable frequency divider 15 at a final stage to generate a strobe signal of a sampling rate (strobe frequency). Since the variable frequency divider 15 may employ an arbitrary frequency division rate, in the case of M frequency division, the following expression is obtained.

$$sampling\ rate\ (strobe\ frequency)=DDSOutput*1/M=Baud\ Rate*1/2^n*\alpha/32*1/M$$

Here, in a case where M=m*α (m is an arbitrary positive number) is defined, α may be abbreviated.

As a result, the following expression is obtained.

$$sampling\ rate\ (strobe\ frequency)=Baud\ Rate*1/2^n*\alpha/32*1/(\alpha*m)=Baud\ Rate*1/2^n*1/2^5*1/(m)=Baud\ Rate/(2^{(n+5)}*m)$$

In reality, the n value is automatically determined according to the Baud Rate. In the case of a 25 GHz band, n=4 (1/16 frequency division) should be satisfied in view of a relationship with the input frequency DDSInput of the direct digital synthesizer 12. Accordingly, the sampling rate (strobe frequency) may be expressed as follows.

$$sampling\ rate\ (strobe\ frequency)=Baud\ Rate/(2^{(n+5)}*m)=Baud\ Rate/2^9*m)$$

Further, a sampling time of each sample may be expressed by an inverse number of the sampling rate, and thus, may be expressed as follows.

$$sampling\ time=1/sampling\ rate=2^9*m/Baud\ Rate=2^9*m\ [UI]$$

Accordingly, phases of $2^9$*m [UI] are shifted at a timing of one-time sampling.

From the above-described expression, in a case where the Baud Rate employs the 25 GHz band, a substantial phase shift amount is determined according to a setting of the frequency division rate (1/m*α) of the variable frequency divider 15 at the final stage.

Figure 2:
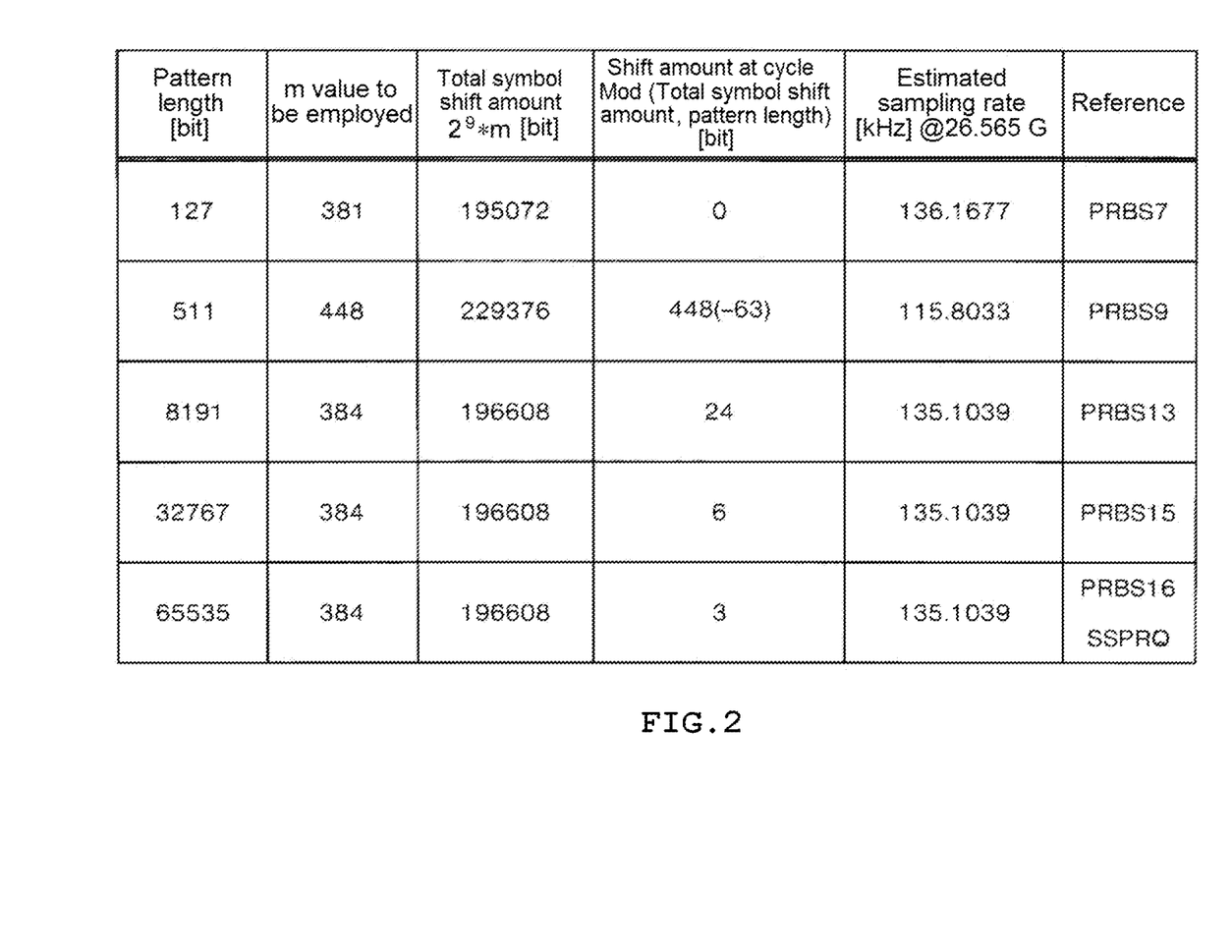
FIG. 2 is a diagram showing an example of an m value, a total symbol shift amount, a shift amount at a cycle (shift amount Mod), and an estimated sampling rate employed in accordance with a pattern length of a pattern signal at a 25 GHz band.

Here, it may be considered that the value m to be employed in accordance with a pattern length is determined as shown in FIG. 2. The m value is determined so that an operation frequency after the m*α frequency division is performed using the variable frequency divider 15 does not exceed an operation frequency of the sampler 4. In the invention, in order to increase a speed, a minimum value that does not exceed the operation frequency of the sampler 4 is determined as the m value.

Further, in a case where it is assumed that the Baud Rate is 26.5625 GHz and the estimated sampling rate is 150 kHz, as shown in FIG. 2, it can be understood that PRBS 7 has a short pattern length, and thus, enables high-speed sampling such as 136 kHz even in an exactly 0-symbol shift (pattern locking state), but in the case of different patterns, a high-speed setting causes a symbol shift. For example, in PRBS 15, a 6-symbol shift occurs, and in PRBS 16 or SSPRQ, a 3-symbol shift occurs. Here, since a large amount of symbol shift does not occur, it is possible to perform pattern locking substantially at the above-mentioned speed through automatic phase adjustment (to be described later).

As a result, as shown in FIG. 2, in a case where it is assumed that the estimated sampling rate is 150 kHz at the Baud Rate of the 25 GHz band, it is possible to perform high-speed sampling regardless of the pattern length (127 symbols, 511 symbols, 8191 symbols, 32767 symbols, and 65535 symbols).

The pattern locking state represents a state where sampling is performed in a specific phase during a pattern cycle.

An ideal pattern locking state refers to a state where a pattern accurately corresponds to an N-cycle of an input pattern for a one sample acquisition time, that is, at a cycle of a sampling rate.

[Configuration of Sampling Oscilloscope]

Next, a configuration of a sampling oscilloscope according to this embodiment for realizing the above-described high-speed sampling will be described with reference to FIG. 1.

As shown in FIG. 1, a sampling oscilloscope 1 has wideband and low noise features, and performs a waveform display of a signal that is an observation target. Thus, the sampling oscilloscope 1 includes a trigger generation circuit 2, a setting section 3, a sampler 4, and an A/D converter 5, a display section 6, and a controller 7.

The trigger generation circuit 2 is a circuit that generates a strobe signal to be used as a sampling timing at which the sampler 4 is operated, and includes a frequency converter 11, the direct digital synthesizer (DDS) 12, the band pass filter 13, an amplifier 14, and the variable frequency divider 15.

The frequency converter 11 is positioned at a front stage of the trigger generation circuit 2, and includes the variable frequency divider 11a and a frequency multiplication circuit 11b, and converts a frequency of a trigger clock (for example, a rectangular wave or a sine-wave) supplied from the outside to an input frequency range (an octave (two-time) range of 1.25 GHz to 2.5 GHz) in which the direct digital synthesizer 12 that is positioned at the next stage can be operated.

In a case where an operation frequency range of the direct digital synthesizer 12 is in the octave (two-time) range, the frequency converter 11 may be configured so that a frequency division rate of the variable frequency divider 11a and a multiplication rate of the frequency multiplication circuit 11b become the power of 2. Further, the frequency converter 11 may not be provided in a case where the trigger clock of the input frequency range in which the direct digital synthesizer 12 can be operated is input from the outside. In this case, the trigger clock may be directly input to the direct digital synthesizer 12 from the outside.

The direct digital synthesizer 12 is connected to the next stage of the frequency converter 11, and includes a reference clock generator, a phase accumulator, a read only memory (ROM) that stores waveform data, and a digital to analog converter (DAC).

The direct digital synthesizer 12 is supplied with an input frequency adjusted in an operation frequency range by the frequency converter 11, and generates an arbitrary waveform or frequency (output frequency) from the trigger clock that is frequency-converted by the frequency converter 11 in a digital manner.

The band pass filter 13 is connected to the next stage of the direct digital synthesizer 12, and limits a pass band of the trigger clock output from the direct digital synthesizer 12 in order to eliminate spurious components.

The amplifier 14 is configured of a low noise amplifier, and amplifies the amplitude of the trigger clock that is band-limited by the band pass filter 13.

The variable frequency divider 15 is connected to the next stage of the amplifier 14, and employs a frequency division rate capable of being variably set (for example, 2 to $1/2^{31}$).

Further, the variable frequency divider 15 is provided at the final stage of the trigger generation circuit 2 in order to generate a sampling timing of the sampler 4. The variable frequency divider 15 adjusts the frequency of the trigger clock that passes through the band pass filter 13 and is amplified by the amplifier 14 in a frequency range in which the sampler 4 can be operated.

Here, a cycle (strobe cycle) of a sampling timing at which the sampler 4 can be driven generally has a kHz order, and thus, it is not practical to directly drive the sampler 4 at the output frequency of the direct digital synthesizer 12 and the band pass filter 13. For this reason, the variable frequency divider 15 at the final stage performs frequency division with respect to the trigger clock passed through the band pass filter 13 down to a frequency at which the sampler 4 can be driven, and outputs a strobe signal that becomes a sampling timing of the sampler 4.

The setting section 3 sets a variety of information necessary for sampling data (pattern signal), and for example, sets a pattern length of data, a symbol rate (bit rate), a clock frequency of a trigger clock, or the like.

The sampler 4 performs a switching operation (closed state, for example, 10 to 100 psec), for example, at hundreds of kHz by using a strobe signal generated by the trigger generation circuit 2 as a sampling timing to sample data (pattern signal) input from the outside.

Data input from the outside is, for example, a known signal having a cycle based on a repetitive pattern input as a test signal to a target measurement object. As the known pattern signal, for example, a pseudo-random bit sequence (PRBS) pattern, a fixed pattern, a programmable pattern based on an arbitrary pattern, or the like, may be used.

The A/D converter 5 converts data based on an analog output sampled by the sampler 4 into digital data.

The display section 6 is configured of a liquid crystal display provided in a main body, for example, and displays a waveform of data (pattern signal), a measurement result obtained by statistical processing, or the like, under the control of the controller 7.

In order to observe a waveform repeated at a high frequency, the controller 7 receives an input of a variety of information set by the setting section 3, and generally controls the trigger generation circuit 2, the sampler 4, the A/D converter 5, and the display section 6.

Specifically, the controller 7 performs frequency division rate settings of the respective sections of the frequency converter 11, the direct digital synthesizer 12, and the variable frequency divider 15, a switching control between the variable frequency divider 11a and the frequency multiplication circuit 11b, a statistical analysis process of data converted by the A/D converter 5, a display control of an observed waveform on the display section 6, and the like.

Further, the controller 7 calculates an estimated sampling rate, a parameter α for settling a DDS output frequency, a parameter m for settling a frequency division rate of the variable frequency divider 15 at the final stage, a total symbol shift amount, and a shift amount at a cycle.

Specifically, the shift amount at the cycle (shift amount Mod) shown in FIG. 2 is as follows.

The shift amount at the cycle (shift amount Mod) represents Mod (total symbol shift amount, pattern length).

For example, in the case of PRBS7, since the pattern length is 127 symbols, the total symbol shift amount becomes 195072, in FIG. 2.

Since 195072 is 1536×127, the shift amount at the cycle becomes 0. That is, shifting is performed by one-time trigger corresponding to 1536 cycles.

In the case of PRBS15, since the pattern length is 32767 symbols, the total symbol shift amount becomes 196608.

It is shown that, since 196608=6×32767+6 and the remainder becomes 6, the shift amount at the cycle becomes 6, and shifting is performed by 6 cycles and 6 unit intervals.

Accordingly, in a case where the phase can be shifted by 6 unit intervals per one-time trigger, it is shown that shifting is performed by just 6 cycles.

More specifically, the estimated sampling rate is calculated from a symbol rate (bit rate) of data (pattern signal) and a clock frequency of a trigger clock. The parameter $\alpha$ is calculated from positive numbers of 18 to 29 so that the output frequency of the direct digital synthesizer 12 is within the pass band of the band pass filter 13. The parameter m is calculated as a minimum value that does not exceed the operation frequency of the sampler 4 so that the operation frequency after the m*$\alpha$ frequency division is performed by the variable frequency divider 15 in the final stage does not exceed the operation frequency of the sampler 4. The total symbol shift amount is calculated from the formula of $2^9$*m. The shift amount at the cycle is calculated from a remainder when the total symbol shift amount is divided by a pattern length. In a case where the remainder exceeds a half of the pattern length, "m-pattern length" may be set as the shift amount at the cycle. For example, as in PRBS 9 of a 511-symbol pattern length shown in FIG. 2, in a case where the total symbol shift amount is 229376 symbols and m is 448, since the remainder becomes 448, 448−511=−63 may be set as the shift amount at the cycle.

Further, in order to automatically update a value of the phase accumulator of the direct digital synthesizer 12 for each sample, the controller 7 includes phase shift amount calculation means 7a and phase adjustment means 7b.

The phase shift amount calculation means 7a calculates a shift amount with respect to a pattern cycle (pattern length) of data (pattern signal) generated by a one-time strobe signal as a phase shift amount.

The phase adjustment means 7b automatically updates the count value of the phase accumulator of the direct digital synthesizer 12 for each sample within a time corresponding to the estimated sampling rate so that the phase shift amount calculated by the phase shift amount calculation means 7a is eliminated, and performs adjustment by shifting a phase by the phase shift amount in a reverse direction (automatic phase adjustment).

Specific Example

Next, a specific example will be described. Here, it is assumed that a symbol rate is 26.5625 Gbit/s that is a basic rate of 400 GbE, an observed pattern is SSPRQ, and an estimated sampling rate is 150 kHz.

An input rate of the direct digital synthesizer 12 becomes 26.5625 G/16=1.660156 GHz. An output frequency of the direct digital synthesizer 12 becomes 1.660156 GHz*21/32=1.089478 GHz through $\alpha$/32=21/32 frequency division in accordance with frequency tuning word (FTW) setting of the direct digital synthesizer 12. Further, the output frequency is subjected to a final frequency division, that is, m*$\alpha$=8064 frequency division in the variable frequency divider 15 to become 1.089578 GHz*1/8064=135.1039 kHz. Thus, a total frequency division rate becomes (1/16)*(21/32)*(1/8064)=1/196608. Since 8064=21*384, 8064 may be abbreviated by 21.

Through the above-described calculation, 196608 symbols are shifted at one sample acquisition time. Since one cycle is 65535 symbols, 196608 symbols become 3 cycles+3 symbols, and thus, it means that every 3-symbol shift occurs.

Accordingly, in this embodiment, in a case where a pattern length of data (pattern signal), a symbol rate (bit rate), and a clock frequency of a trigger clock are set by the setting section 3, the controller 7 calculates an estimated sampling rate, the parameter $\alpha$, the parameter m, and a total symbol shift amount, calculates a shift amount with respect to a pattern cycle (pattern length) of data generated by a one-time strobe signal as a phase shift amount, and phase-shifts 3 symbols that are a phase shift amount in a reverse direction for each sample to perform automatic phase adjustment.

That is, in the automatic phase adjustment of this embodiment, the phase shift amount calculation means 7a of the controller 7 calculates 3 symbols that are the shift amount with respect to the pattern cycle (pattern length) of the data generated by the one-time strobe signal as the phase shift amount (phase shift amount calculation step). Further, the phase adjustment means 7b of the controller 7 automatically updates a count value of the phase accumulator of the direct digital synthesizer 12 within a time (6 μs) corresponding to an estimated sampling rate (150 kHz) and shifts the phase in the reverse direction by 3 symbols that are the phase shift amount to perform phase adjustment so that 3 symbols that are the phase shift amount calculated by the phase shift amount calculation means 7a are eliminated for each sample (phase adjustment step).

For example, in a case where a pattern signal (SSPRQ) having a pattern length of 65535 symbols in FIG. 2 is set as observed data, and in a case where the automatic phase adjustment of this embodiment is not performed, since a total symbol shift amount (196608 symbols) does not have the pattern length (65535 symbols) as a divisor, m becomes 65535, pattern locking is performed at a sampling speed of an estimated sampling rate (791.63628 Hz) from the expression of Baud Rate/($2^9$*m). On the other hand, in a case where the automatic phase adjustment of this embodiment is performed, pattern locking is performed at a sampling speed of an estimated sampling rate (135.1039 kHz), and thus, it is possible to perform pattern locking at higher speed compared with the case where the automatic phase adjustment is not performed.

Further, as shown in FIG. 2, in a case where it was assumed that the estimated sampling rate was 150 kHz at the Baud Rate of the 25 GHz band, the result that high-speed sampling could be performed was obtained, regardless of the pattern length (127 symbols, 511 symbols, 8191 symbols, 32767 symbols, 65535 symbols).

In the specific example, it is assumed that the symbol rate is 26.5625 Gbit/s (400 GbE basic rate), SSPRQ is set as the observation pattern, and the estimated sampling rate is 150 kHz, but the invention is not limited thereto.

Modification Example

Next, a modification example will be described. In this embodiment, as shown in FIG. 1, the direct digital synthesizer 12 is mainly controlled to generate a trigger frequency. In the case of random sampling for displaying an eye diagram, a sampling clock is generated by controlling the frequency through frequency tuning word control, but in the case of sequential sampling, a real phase control is adapted according to a phase control of the direct digital synthesizer 12.

Figure 3:
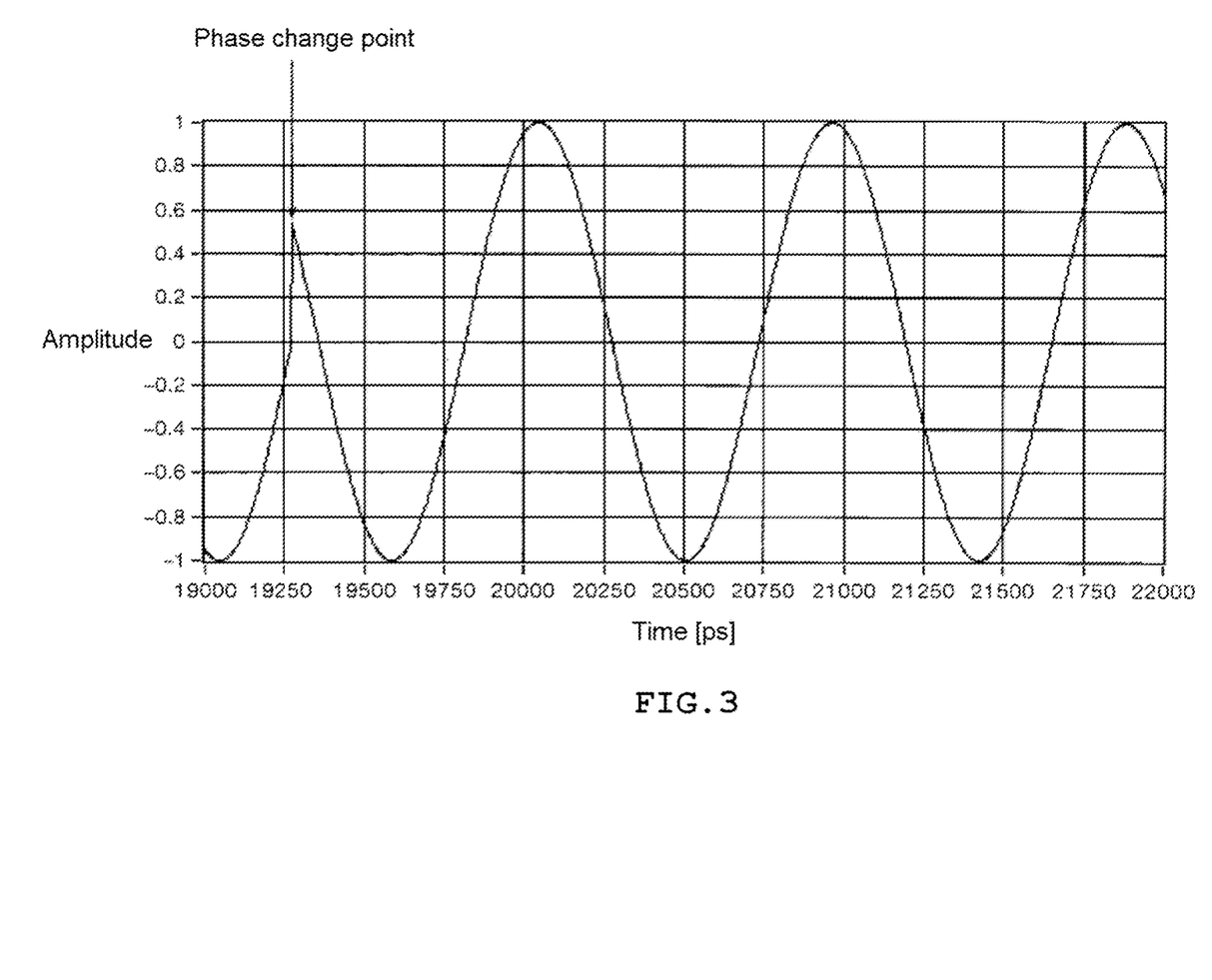
FIG. 3 is a waveform diagram showing an output clock indicating a state where a phase flies when a count value of a phase accumulator of a direct digital synthesizer (DDS) is shifted.

The phase control is performed to shift a count value of the phase accumulator inside the direct digital synthesizer 12 by FTW+β. Thus, in an output clock, phase modulation as shown in FIG. 3 is observed. Ideally, as indicated by a phase change point in FIG. 3, since a phase flies, the shape of a sine-wave becomes non-continuous.

On the other hand, in an actual circuit, as shown in FIG. 1, the band pass filter 13 is provided for eliminating an unnecessary wave at the output stage of the direct digital synthesizer 12, and the amplitude becomes low at a non-continuous point using the band pass filter 13. While amplification is performed by the amplifier 14 provided at the output stage of the band pass filter 13, finally, the output clock including the clock of which the amplitude becomes low is input to the variable frequency divider 15. Accordingly, in a case where the amplitude is attenuated through phase modulation to become a predetermined level or higher, it is not possible to properly drive the variable frequency divider 15, and a phase of the output of the variable frequency divider 15 becomes abnormal.

It is considered that this is directly because a phase modulation amount increases, a high frequency component is obtained at a phase modulation timing, and the level of an output of the band pass filter 13 is lowered according to a result that the band pass filter 13 cannot pass through the component. Since an amplitude attenuation amount depends on a phase modulation amount (the amplitude attenuation becomes small as the phase change amount becomes small), in a case where the phase modulation amount is small, there is substantially no problem.

However, the output clock frequency of the direct digital synthesizer 12 is equal to or larger than 1 GHz. On the other hand, a final strobe frequency is about 150 kHz, and thus, the output clock frequency and the final strobe frequency are noticeably different from each other. For example, in a case where the phase accumulator of the direct digital synthesizer 12 in this embodiment is mounted inside a field programmable gate array (FPGA) and 1/3 of a trigger clock is set as a system clock, since the trigger clock input to the direct digital synthesizer 12 is at least 1.25 GHz, the system clock becomes at least 416 MHz, which is sufficiently faster than the strobe frequency.

Accordingly, in a case where the phase modulation is considered, since it is sufficient if the phase modulation can be performed at each strobe, a time necessary for the phase modulation becomes 150 kHz ($\cong 6$ μs). In this regard, as a modulation example, a process of reducing a phase modulation amount that may be changed one time to perform an automatic phase modulation a plurality of times may be performed, and accordingly, it is possible to solve the above-mentioned problems.

Figure 4:
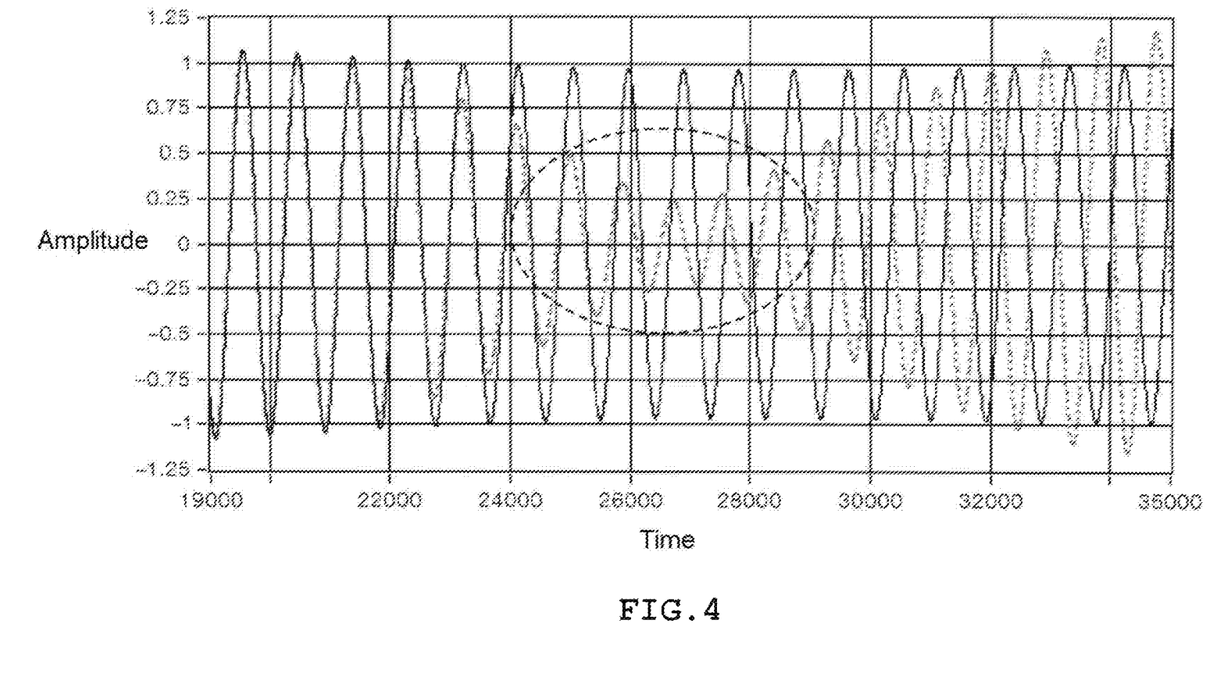
FIG. 4 is a waveform diagram showing respective output clocks in a case where a 10-symbol phase modulation is performed one time (dotted line) and in a case where a phase modulation is not performed (solid line).
Figure 5:
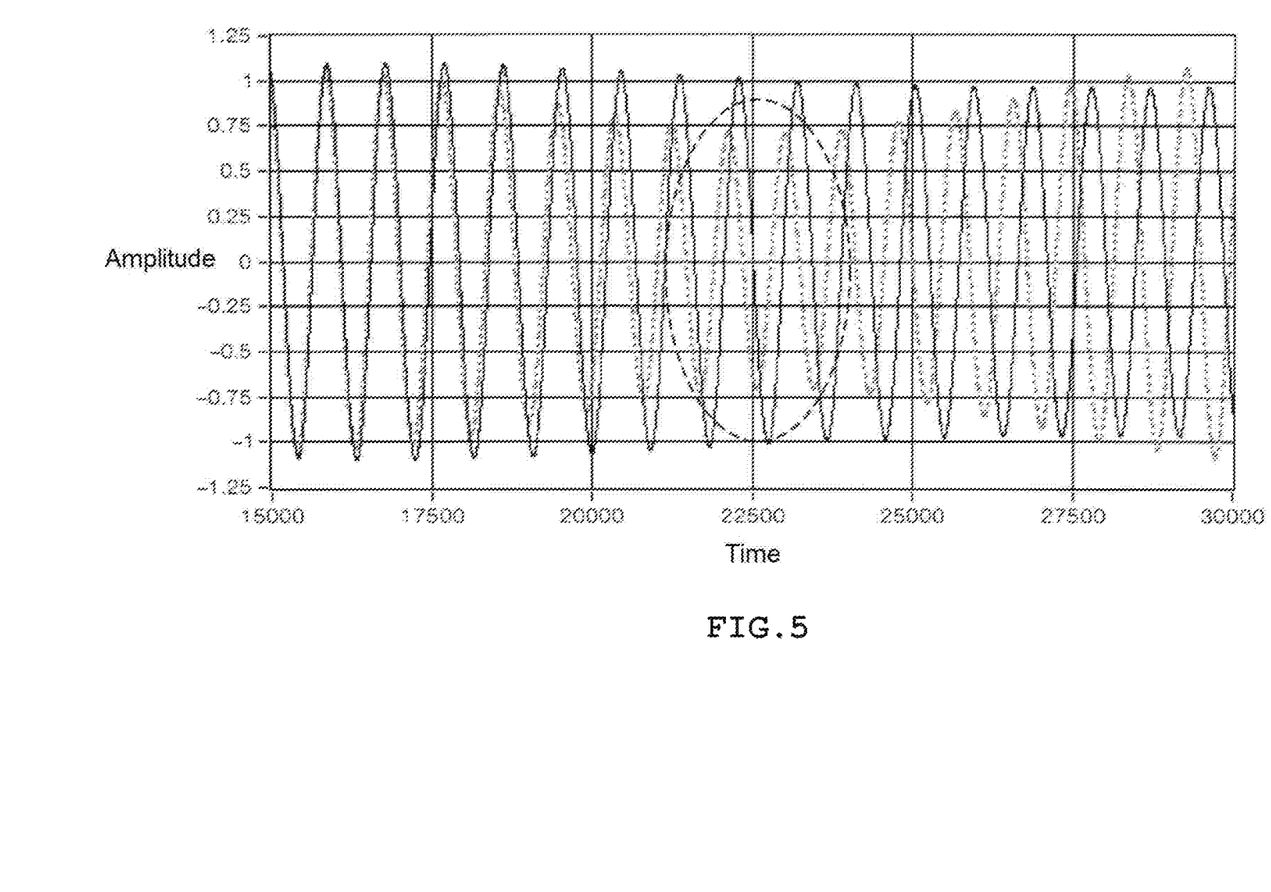
FIG. 5 is a waveform diagram showing respective output clocks in a case where a 10-symbol phase modulation is dividedly performed four times (dotted line) and in a case where a phase modulation is not performed (solid line).

Here, FIG. 4 is a waveform diagram showing respective output clocks in a case where a 10-symbol phase modulation is performed one time (dotted line) and in a case where a phase modulation is not performed (solid line). FIG. 5 is a waveform diagram showing respective output clocks in a case where a 10-symbol phase modulation is dividedly performed four times (dotted line) and in a case where a phase modulation is not performed (solid line).

In comparing a portion surrounded by a dashed line in FIG. 4 with a portion surrounded by a dashed line in FIG. 5, it can be understood that in a case where the 10-symbol phase modulation is dividedly performed four times, it is possible to reduce the attenuation amount compared with the case where the 10-symbol phase modulation is performed one time. As a result, by dividedly performing the phase modulation a plurality of times, it is possible to drive the variable frequency divider 15 without malfunction.

As described above, according to the embodiment of the invention, it is possible to perform pattern locking at a sampling speed faster than that in the related art even in the case of long-cycle pattern data (pattern signal), to thereby realize data analysis using the pattern locking at high speed. As a specific numerical value, for example, in a case where a sampling speed is calculated from the expression of Baud Rate/($2^9$*m) in the case of a pattern signal SSPRQ of a pattern length (65535 symbols) calculated through PAM 4 measurement in Institute of Electrical and Electronics Engineers (IEEE) 802.3bs, while only a sampling speed of about 800 Hz can be realized in the related art, it is possible to achieve a sampling speed of about 150 kHz, and thus, it is possible to perform data analysis using pattern locking at higher speed compared with the related art.

Hereinabove, the preferred embodiments of the trigger generation circuit, the trigger generation method, the sampling oscilloscope, and the sampling method according to the invention have been described, but the invention is not limited to the description and drawings according to the embodiments. That is, different embodiments, modifications, operational techniques, or the like capable of being obviously made by those skilled in the art on the basis of the above-described embodiments are included in the technical scope of the invention.

DESCRIPTION OF REFERENCE NUMERALS AND SIGNS

1 Sampling oscilloscope
2 Trigger generation circuit
3 Setting section
4 Sampler
5 A/D converter
6 Display section
7 Controller
7a Phase shift amount calculation means
7b Phase adjustment means
11 Frequency converter
11a Variable frequency divider
11b Frequency multiplication circuit
12 Direct digital synchronizer (DDS)
13 Band pass filter (BPF)
14 Amplifier
15 Variable frequency divider

What is claimed is:
1. A sampling oscilloscope comprising:
a trigger generation circuit that includes a direct digital synthesizer (DDS) that has a phase accumulator and outputs a trigger clock at an output frequency on the basis of a count value of the phase accumulator, a band pass filter that limits a pass band of the trigger clock from the direct digital synthesizer, and a variable frequency divider that divides a frequency of the trigger clock of which the pass band is limited by the band pass filter, and generates a strobe signal for sampling an input pattern signal; and
a controller that controls the direct digital synthesizer and the trigger generation circuit,
wherein the controller calculates a phase shift amount of a strobe cycle of the strobe signal with reference to a pattern cycle of the input pattern signal, and adjusts a phase by changing the count value of the phase accumulator of the direct digital synthesizer so that the calculated phase shift amount is eliminated.

2. The sampling oscilloscope according to claim 1, wherein the controller performs the change of the count value for the adjustment of the phase shift amount a plurality of times.

3. The sampling oscilloscope according to claim 2, wherein the count value is changed within one pattern cycle of the input pattern signal.

4. The sampling oscilloscope according to claim 1, wherein the input pattern signal is sampled by a sampler at a sampling timing based on the strobe signal.

5. A method comprising:
generating a strobe signal for sampling an input pattern signal using a trigger generation circuit that includes a direct digital synthesizer (DDS) that has a phase accumulator and outputs a trigger clock at an output frequency on the basis of a count value of the phase accumulator, a band pass filter that limits a pass band of the trigger clock from the direct digital synthesizer, and a variable frequency divider that divides a frequency of the trigger clock of which the pass band is limited by the band pass filter;
calculating a phase shift amount of a strobe cycle of the strobe signal with reference to a pattern cycle of the input pattern signal; and
adjusting a phase by changing the count value of the phase accumulator of the direct digital synthesizer so that the calculated phase shift amount is eliminated.

6. The method according to claim 5, further comprising:
performing the change of the count value for the adjustment of the calculated phase shift amount a plurality of times.

7. The method according to claim 6, wherein the count value is changed within one pattern cycle of the input pattern signal.

8. A sampling method comprising sampling the input pattern signal using a sampler at a sampling timing based on the strobe signal, generated by the method according to claim 4.

* * * * *